Sept. 18, 1962 HSIN HSU WEI 3,054,955
REFLEX TRANSISTOR AMPLIFIER
Filed June 10, 1959
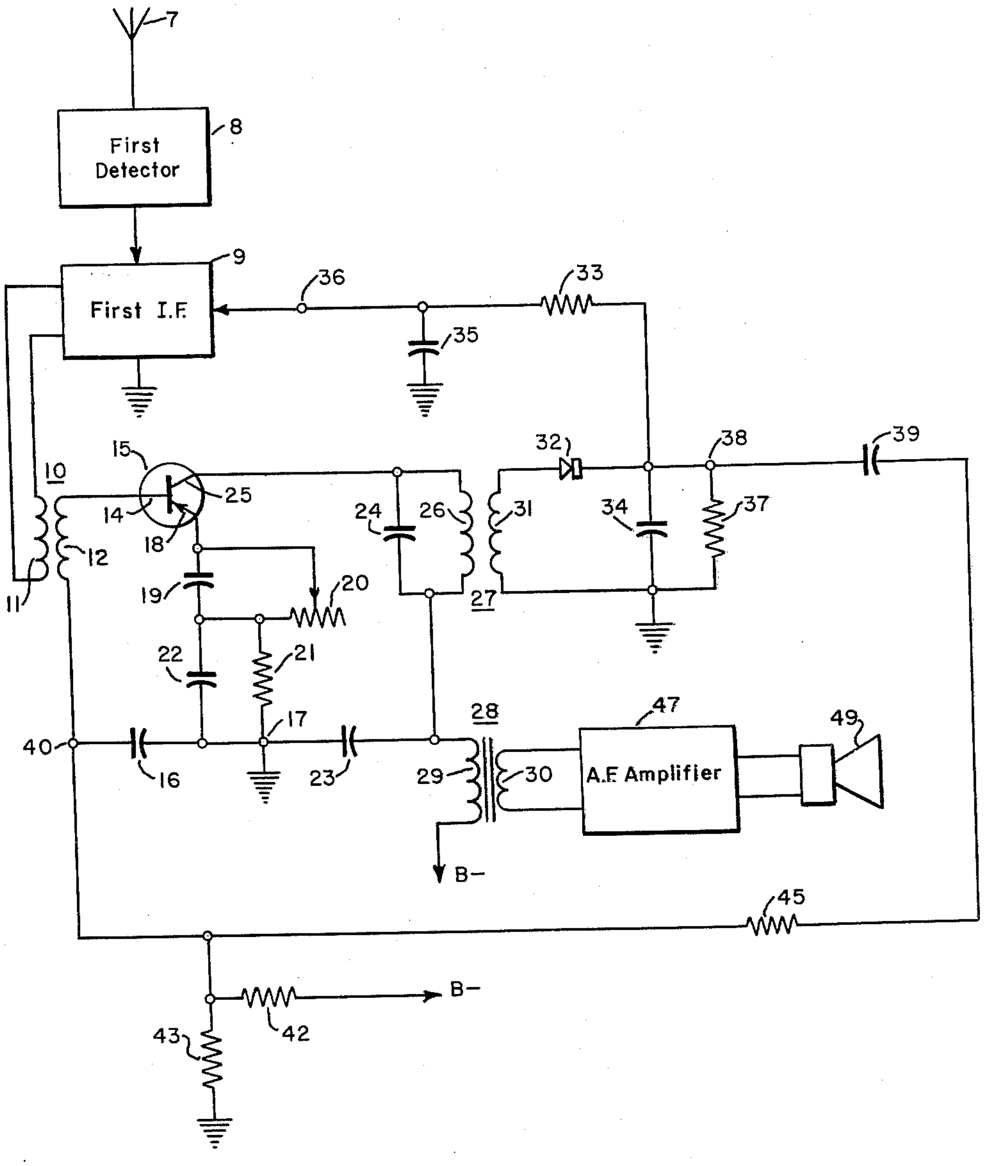
WITNESSES
Leon J. Taga
Leon M. Garman
INVENTOR
Hsin Hsu Wei
BY Benjamin DeWitt
ATTORNEY United States Patent Office 3,054,955

Patented Sept. 18, 1962

3,054,955

REFLEX TRANSISTOR AMPLIFIER

Hsin Hsu Wei, Bloomfield, N.J., assignor to Westinghouse Electric Corporation, East Pittsburgh, Pa., a corporation of Pennsylvania Filed June 10, 1959, Ser. No. 819,306
5 Claims. (Cl. 325—319)

The present invention relates to amplifiers and more particularly to an improvement in reflex amplifier circuits for radio wave receiving apparatus.

"Reflex Circuit" is defined by Chambers Technical Dictionary, first edition (1940), The MacMillan Company, New York, as: "a circuit, sometimes employed in radio receivers, in which one or more valves are used for simultaneously high- and low-frequency amplification."

Reflex circuits in general are of importance as amplifiers in that they reduce the number of separate signal amplifying devices required to amplify a small signal input to a level high enough to drive signal utilization means such as, for example, the push-pull audio output stage of a broadcast receiver. In conventional reflex circuits an alternating current input signal such as, for example, the audio signal modulated 455 kilocycle intermediate frequency carrier of a radio receiver is amplified by the reflex amplifying device and applied through a first coupling means to a modulation detector. The audio frequency demodulation products are coupled back to the input circuit of the reflex amplifying device and are further amplified and applied through a second coupling means or low frequency load impedance to the low frequency signal utilization means. Reflex circuits thus achieve double amplification with the use of a single active amplifying element.

The previously known, above described concept of using a single amplifying element for simultaneous amplification of radio frequency signals and low frequency signals recently has been applied advantageously in the design of low cost transistorized broadcast receivers. Reflexing has acquired renewed importance in connection with transistor receivers because of the fact that the maximum amplification obtainable from transistors is limited, thereby requiring the use of multiple stages of intermediate frequency amplification and multiple stages of audio frequency amplification in broadcast receivers.

One recently used circuit of the general type with which the present invention is concerned may be found in the technical journal "Electronics" for May 8, 1959 at pages 70 to 72. In such transistor receivers, the reflex circuit, normally used as a second IF amplifier and a first audio amplifier can provide as much gain from a single transistor as would normally be obtainable from two conventional transistor amplifier circuits connected in cascade. Reflex amplifiers of the general type described by the Electronics article have been characterized by instability, distortion and malfunction at high input signal levels. In addition, such amplifiers have been susceptible to output signal deterioration as a result of decrease in the B+ voltage of the energizing potential source. More specifically, one difficulty encountered with reflex amplifiers is that when an input signal of abnormally great amplitude is applied, the transistor will be driven to cut-off on negative excursions of input waves so that the transistor operates to rectify or detect the intermediate frequency carrier signal as well as amplifying the same. Under that circumstance, the demodulation products or audio signals are delivered from the transistor output circuit directly to the audio load, without passing through the second detector in the intended manner. Automatic gain control voltage is normally derived from the second detector and the audio signal volume control is conventionally connected across the second detector output. Accordingly, when the reflex intermediate frequency amplifier operates to detect strong input signals, the resulting demodulation products bypass the volume control and are fed directly to the audio output circuits so that the volume control is rendered inoperative to reduce the sound volume. The described malfunction of conventional reflex circuits is aggravated by variation in the supply voltage. For example, in a battery operated receiver, wherein the amplifier energizing voltage decreases as the batteries become discharged, the transistor operating point is gradually shifted with respect to the transistor characteristic curves, so that any stronger than normal input signal will be rectified by the transistor with the resulting rectification products constituting a distorted audio signal which passes directly to the audio signal utilization circuits without being subjected to control by the conventional volume control potentiometer.

It is a primary object of the present invention to provide an improved circuit for simultaneous amplification of radio frequency and low frequency signals which overcomes the aforementioned difficulties.

It is another object of the present invention to provide an amplifier of the type described with means for reducing the amplification factor thereof as the input signal strength increases.

It is a further object of the present invention to provide reflex amplifier means for radio wave receivers in which degenerative feedback is utilized to alleviate the problems of distortion and "play through" of high level input signals.

It is a different object of the present invention to provide a reflex amplifier for use in broadcast radio receivers with volume control means arranged to adjustably degenerate both the radio frequency and the audio frequency signals in the circuit whereby the output audio signal level may be controlled in the presence of abnormally strong radio frequency input signals.

It is still another object of the present invention to provide a transistor reflex amplifier for radio receivers having improved frequency response and reduced audio frequency waveform distortion.

The foregoing and other objects of this invention will be apparent from the following description taken in accordance with the accompanying drawing, in which drawing the single FIGURE is a schematic circuit diagram of a reflex amplifier circuit embodying the invention.

The theory of operation of transistors as amplifying devices has been set forth at length in various patents and published technical articles. Accordingly, no description will be given of such theory herein, except as relates to the function of such devices in the circuit here considered. The reflex circuit of the present invention utilizes a transistor triode which is disclosed in the drawing as being a p-n-p type transistor. It is to be understood, of course, that n-p-n transistors may alternatively be used with the necessary changes in circuit connections and biasing potentials being made as will be readily apparent to persons skilled in the art.

The present invention is hereinafter described as it is embodied in the intermediate frequency amplifier, detector, and audio frequency amplifier system of a conventional broadcast radio. It is to be understood, however, that the invention may have broad application to any system of receiving intelligence modulated radio frequency waves wherein the signal strength may vary from time to time and wherein means is required for adjustably controlling the amplitude or strength of the derived intelligence signal.

Referring now to the drawing, the intelligence modulated radio waves are picked up by antenna 7, are transmitted through a conventional first detector 8 which converts the signal to an intermediate frequency carrier wave. The intelligence modulated IF carrier is applied from detector 8 to a first intermediate frequency amplifier 9. The intermediate frequency amplifier 9 may be of conventional construction and is provided, in accordance with the conventional practice, with an automatic gain control (AGC) signal from an AGC bus 36.

The audio frequency modulated intermediate frequency carrier wave output from the first amplifier 9 is applied to the primary winding 11 of an intermediate frequency transformer 10 having a secondary winding 12. In accordance with conventional practice, the transformer 10 has at least its primary winding 11 tuned to the intermediate frequency of the carrier signal applied from amplifier 9. The intermediate frequency may, for example, be 455 kilocycles. The secondary winding 12, in the input circuit of transistor 15, is connected at its lower end to a capacitance 16 which is in turn connected at 17 to a point of reference potential, for example, ground. Emitter electrode 18 of p-n-p transistor 15 is connected directly to the slidable contact of a volume control potentiometer 20. One end of the resistance member of potentiometer 20 remains unconnected and the other end is connected through a biasing resistor 21 to ground at 17. Biasing resistor 21 is shunted by a bypass capacitor 22 which has a low impedance as compared to that of resistor 21 to audio frequency signals as well as to the intermediate frequency carrier signals. While not essential to the present invention, a capacitor 19 may be provided in shunt with the potentiometer 20 to obtain improved performance under certain circumstances. Capacitor 19 should be selected to have a low impedance to carrier frequency signals and to have a relatively high impedance to signals in the audio frequency range. The transistor amplifying device 15 is provided with an output circuit including an intermediate frequency transformer 27 having a primary winding 26 and a secondary winding 31. The output circuit further includes an audio frequency load in the form of an audio frequency transformer 28 having a primary winding 29 and a secondary winding 30. The primary windings 26 and 29 are connected in series between the collector electrode 25 of the transistor 15 and a source of direct current energizing potential B−. The source of energizing potential (not shown) has its positive terminal connected to ground or to the point of reference potential 17 in accordance with conventional practice.

The primary winding 26 of IF transformer 27 is shunted by a capacitor 24 and is tuned to the frequency of the IF carrier signal. The primary winding 29 of audio frequency transformer 28 is shunted by a bypass capacitor 23 having a low impedance to intermediate frequency signals and a relatively high impedance to signals in the audio frequency range. Secondary winding 31 of transformer 27 is connected on one side to ground or to a point of reference potential and on the other to a diode 32. The output circuit of the diode 32 consists of a load resistor 37 connected at point 38 to the cathode of the diode 32 and connected at its other end to ground or the point of reference potential 17. Resistor 37 is shunted by an IF frequency bypass capacitor 34 for removing radio frequency components from the demodulation products produced by the demodulation circuit. Thus, transformer 27 together with diode 32, load resistor 37 and capacitor 34 constitutes a detector circuit coupled to the output circuit of transistor 15 and operative in response to amplified carrier signals to produce demodulation products including (1) an audio frequency signal representative of the modulation envelope of the carrier signal, and (2) a direct current voltage across capacitor 34 which varies as a direct function of the intermediate frequency carrier signal strength produced by amplifier 15. The audio frequency signal developed across the detector load resistance 37 is applied from junction point 38 through a coupling capacitor 39 and a series connected isolation resistor 45 to the junction point 40 between capacitor 16 and the lower end of secondary winding 12 of IF transformer 10. Isolation resistor 45 prevents intermediate frequency signal from being coupled from transformer winding 12 to the detector circuit. Since secondary winding 12 of IF transformer 10 is tuned to the IF frequency, it will present practically no impedance to the audio signal applied thereto from capacitor 39.

Capacitor 16 is selected to have a low impedance to the intermediate frequency carrier signal and to have a relatively high impedance to signals in the audio frequency range. Accordingly, the audio signal applied from the detector is developed at junction point 40 across capacitor 16 and is applied through secondary winding 12 to the base electrode 14 of transistor 15. Thus, transistor amplifier 15 is provided with a second input signal including signal components in the audio frequency range, that is, up to approximately 20,000 cycles per second. Amplifier transistor 15 amplifies the audio signal to provide an amplified audio frequency output at collector electrode 25. Since transformer 27 is tuned to the intermediate frequency it presents negligible impedance to the audio frequency output signal from collector 25 and, accordingly, the amplified audio signal appears across the primary winding 29 of output transformer 28. The amplified audio output signal from audio transformer 28 is applied from secondary winding 30 to the input terminals of a conventional audio amplifier 47 which has its output terminals connected directly to a loud speaker 49 or other conventional intelligence signal utilization means such as, for example, a tape recording apparatus or the like.

From the foregoing it will be noted that transistor 15 operates as an audio amplifier so that additional gain at audio frequencies is obtained while it simultaneously operates as a conventional intermediate frequency amplifier of the signal prior to application of the intermediate frequency carrier signal to the detector circuit comprising rectifier 32 and its associated circuit elements. Operation of transistor 15 in the reflex mode, as described, enables it to produce as much overall signal gain as could normally be provided by two transistors connected respectively fore and aft the detector circuit.

In addition to providing the audio signal through capacitor 39, the demodulation circuit provides at terminal 38 a direct current component of the demodulation products which is applied through an isolating resistor 33 and across a filter capacitor 35 to the automatic gain control bus 36. The filter capacitor 35, connected from the bus 36 to ground, and the resistor 33, connected between the bus 36 and the terminal 38, constitute an RC filter network for excluding audio frequency signal components from the bus 36. Thus, the voltage developed across capacitor 35 is a direct current voltage independent of audio frequency modulation of the carrier signal and variable as a function of long term changes in the average peak-to-peak amplitude of the intermediate frequency carrier wave applied from amplifier 15 to transformer 27. The automatic gain control voltage thus developed at the bus 36 is applied to the first IF amplifier 9 to regulate the gain thereof in accordance with conventional practice.

Direct current biasing of the base-to-emitter current path of transistor 15 is provided by a voltage divider comprising resistors 42 and 43 connected in series between the voltage source B— and ground. The junction point of resistors 42 and 43 is connected to terminal 40 and thereby applies a bias potential corresponding to the drop across resistor 43 to the base electrode 14 of transistor 15. Emitter current flow through resistors 21 and potentiometer 20 to the emitter electrode 18 provides a dynamic biasing potential at emitter 18 for stabilizing the operation of the transistor 15.

In the operation of reflex circuits of the type described, there is a tendency for strong incoming signals applied through transformer 10 to the input circuit of the transistor to overdrive the transistor so that rectification of the carrier signal takes place. The undesirable demodulation products thus created by transistor 15 in response to strong carrier signals would flow unimpeded through transformer 26 and appear across the audio output transformer 28.

If the volume control were connected across the output of the detector circuit, that is, from terminal 38 to ground with its adjustable slider being connected to capacitor 39 as is the conventional practice, the undesired audio signals produced by rectification in transistor 15 would completely bypass the detector and the volume control and would be applied to the audio amplifier 47 without being subject to adjustment of the amplitude thereof. In addition, when rectification takes place in transistor 15, the intermediate frequency carrier signals coupled through transformer 27 may be considerably smaller in average amplitude than would be the case if the transistor 15 were operating properly. Accordingly, the automatic gain control bias developed at bus 36 does not respond to further variations in the carrier signal strength and as a result further increases in carrier signal strength will further aggravate the overdriven condition of transistor 15 so that the undesired and distorted audio signal produced by rectification in transistor 15 is further increased, with the abnormal operation being self-aggravating.

The circuit of the present invention overcomes the foregoing difficulties by providing the volume control potentiometer 20 connected in the emitter circuit of the transistor 15 rather than being connected across the detector output as is the usual practice.

In operation, the circuit of the present invention utilizes the principle of degeneration. When the volume control 20 is adjusted to provide a finite resistance between the upper end of capacitor 22 and the emitter 18, the un-bypassed resistance presents a degenerative effect to both intermediate frequency signals and audio frequency signals applied to the input circuit of the transistor. The degeneration provided by volume control 20 reduces the gain of transistor 15 thereby reducing the peak-to-peak amplitude of the intermediate frequency signal output therefrom. The reduced audio signal thus produced by the detector and applied through capacitor 39 to the input circuit of the transistor is further degenerated by the reduced audio frequency gain of the transistor 15 so that the audio output signal applied through transformer 28 is maintained at any desired level.

The degenerative feedback provided by volume control 20 is proportional to the incoming signal strength. Accordingly, the circuit of the present invention has more AGC action than that provided by previously known arrangements.

If it is further desired to increase the AGC action so that the output signal will have even a smaller change in response to further decreases in the carrier signal input amplitude such improved AGC performance may be obtained by providing the capacitor 19 shunted across the active portion of the volume control 20. Capacitor 19 is selected to have a high impedance to audio signals applied thereto and to have a relatively much lower impedance to intermediate frequency carrier signals. Thus, capacitor 19 partially bypasses the volume control 20 at intermediate frequencies so that the amplitude of carrier signal output applied to transformer 26 is not so radically reduced when the active resistance of the volume control 20 is increased. Thus, provision of capacitor 19 provides a larger AGC voltage at bus 36 for any given setting of the volume control 20.

The provision of capacitor 19 also provides a somewhat increased amplitude of audio signal output from the output terminal 38 of the detector. However, since the capacitor 19 has a high impedance at audio frequencies, it does not reduce the degeneration of the audio signal which is fed back through resistor 45 to the input circuit of the transistor 15. Accordingly, with capacitor 19 connected across the active portion of the volume control 20, the volume control 20 is effective to provide degeneration of the audio signal by applying negative feedback to the input circuit of the transistor 15. The volume control 20 is effective to control the amplitude of the audio output signal applied through transformer 28 to the audio amplifier 47. Provision of capacitor 19 prevents changes in the setting of the volume control 20 from affecting or seriously reducing the gain of the AGC loop which includes transistor 15, the detector circuit, AGC bus 36 and the first IF amplifier 9.

Further, the setting of the volume control 20 has an additional desirable effect on the values of the forward biasing potential applied to transistor 15 and further reduces the collector voltage as the input carrier signal increases so that the audio output amplitude is further relatively reduced as the input carrier signal increases. The circuit of the present invention thus greatly reduces the problem of inadvertent "play through" of audio signals resulting from demodulation of the carrier in the intermediate frequency amplifier 15. At the same time, the degeneration or negative feedback provided by volume control 20 is effective to preserve the audio frequency waveform by preventing distortion and generally enhances the audio frequency response characteristic of the audio amplifier system including transistor 15 and output amplifier 47.

In one actual physical embodiment of the reflex amplifier in accordance with the present invention, the following exemplary component values were successfully employed:

*Table I*

| | Ohms |
|---|---|
| Resistor 20 | 4500 |
| Resistor 21 | 220 |
| Resistor 33 | 1500 |
| Resistor 37 | 5600 |
| Resistor 42 | 8200 |
| Resistor 43 | 1500 |
| Resistor 45 | 220 |
| | **Microfarads** |
| Capacitor 16 | 0.01 |
| Capacitor 19 | 0.01 |
| Capacitor 22 | 75 |
| Capacitor 23 | 0.01 |
| Capacitor 34 | 0.02 |
| Capacitor 35 | 10 |
| Capacitor 39 | 5 |
| Rectifier 32 | Type 1N295 |
| Transistor 15 | Type 2N410 |

It is to be understood, of course, that the foregoing tabulated component values are given merely by way of example and are not intended to limit the present invention in any way.

Further, while the present invention has been shown in one form only, it will be obvious to those skilled in the art that it is not so limited but is susceptible of various changes and modifications without departing from the spirit and scope thereof.

I claim as my invention:

1. In combination, a semiconductor amplifier for simultaneous radio frequency and audio frequency amplification having first, second and third electrodes, a source of audio frequency modulated radio frequency oscillations coupled between said first and second electrodes, whereby said oscillations are amplified by said amplifier and reproduced in amplified form at said third electrode, means coupled between said second and third electrodes to demodulate said oscillations after amplification by said amplifier, means to apply the demodulation products from said demodulation means to said first electrode so that said demodulation products are amplified by said amplifier and reproduced at said third electrode, means coupled between said second and third electrodes to receive and utilize said demodulation products while excluding said radio frequency oscillations, and volume control means including a variable resistance device, unbypassed relative to said demodulation products, connected between said second electrode and said last mentioned means for adjustably controlling the amplification of said audio frequency demodulation products.

2. In a radio wave receiver, a reflex amplifier circuit for simultaneous amplification of radio frequency and low frequency signals comprising: a transistor having first, second and third electrodes; a signal input circuit for said transistor comprising a transformer tuned to the IF carrier frequency of said receiver and capacitive means connected in series with the secondary of said transformer; an output circuit for said transistor connected to said third electrode and including an output inductance tuned to said IF carrier frequency; a demodulation stage coupled to said output circuit for demodulating said IF carrier after amplification by said transistor; coupling circuit means extending from said stage to said transformer for applying low frequency demodulation products to said input circuit whereby said products are amplified by said transistor; means exhibiting low impedance to said carrier frequency signals and relatively high impedance to said low frequency demodulation products connected in said output circuit in series with said inductance for separately deriving an output signal corresponding to said products; and volume control means including a variable resistance device, unbypassed relative to said demodulation products, connected in said input circuit between said second electrode and said capacitive means for applying degenerative feedback to said input circuit to adjustably control the amplification of said demodulation products.

3. In a radio wave receiver, a reflex amplifier circuit for simultaneous amplification of radio frequency and low frequency signals comprising: a transistor having first, second and third electrodes; a signal input circuit for said transistor comprising a transformer tuned to the IF carrier frequency of said receiver and capacitive means connected in series with the secondary of said transformer; an output circuit for said transistor connected to said third electrode and including an output inductance tuned to said IF carrier frequency; a demodulation stage coupled to said output circuit for demodulating said IF carrier after amplification by said transistor to produce low frequency signals corresponding to the modulation of said carrier; coupling circuit means extending from said stage to said transformer for applying said low frequency signals to said input circuit whereby said signals are amplified by said transistor; means exhibiting low impedance to said carrier frequency signals and relatively high impedance to said low frequency signals connected in said output circuit in series with said inductance for separately deriving an output signal corresponding to said low frequency signals; and volume control means including a variable resistance device unbypassed relative to said low frequency signals, connected between said second electrode and said capacitive means for applying degenerative feedback to said input circuit to adjustably control the amplification of said low frequency signals.

4. In a radio receiver, a transistor amplifier for simultaneous high and low frequency amplification including a base electrode, a collector electrode and an emitter electrode, a source of direct current having a positive terminal connected to a point of reference potential, first and second load circuits respectively responsive to radio frequency and audio frequency signals connected serially between said collector electrode and the negative terminal of said source, a source of audio frequency modulated radio frequency signal connected between said base and emitter electrodes for applying said signal to said base electrode to produce an amplified radio frequency signal at said collector electrode, means coupled to said first load circuit for demodulating said amplified radio frequency signal, audio frequency coupling means to supply the demodulation products to said amplifier between said point of reference potential and the terminal of said signal source opposite said base electrode, whereby said demodulation products are amplified by said amplifier and supplied from said collector electrode to said second load circuit, and volume control means comprising a variable resistance device, unbypassed relative to said demodulation products, connected between said emitter electrode and said point of reference potential for controlling the audio frequncy amplification factor of said amplifier.

5. In an amplifier for simultaneous amplification of a modulated carrier signal and intelligence signals of substantially lower frequencies; a semiconductor device having first, second and third electrodes; means for impressing said carrier signal between said first electrode and a point of reference potential; first and second coupling transformers each including a primary winding and a secondary winding with said primary windings being connected in series with each other between said third electrode and said point of reference potential; said first transformer being tuned to present a relatively high impedance to said carrier signal and said second transformer being adapted to present a low impedance to said carrier signal; means coupled to the secondary winding of said first transformer for demodulating said carrier signal to produce intelligence signals corresponding to the modulation of said carrier signal; coupling means to impress said intelligence signals between said first electrode and said point of reference potential; volume control means including a variable resistance element shunted by means presenting a low impedance to said carrier signal connected between said second electrode and said point of reference potential for variably controlling the amplification of said intelligence signal without substantially affecting the amplification of said carrier signal.

References Cited in the file of this patent

UNITED STATES PATENTS

| | | |
|---|---|---|
| 1,723,719 | Ballantine | Aug. 6, 1929 |
| 2,777,056 | Bull | Jan. 8, 1957 |
| 2,916,616 | Boscia | Dec. 8, 1959 |

FOREIGN PATENTS

| | | |
|---|---|---|
| 645,849 | Great Britain | Nov. 8, 1950 |

OTHER REFERENCES

Article, R.C.A. Technical Notes No. 30, dated Aug. 9, 1957.

Article, "Design Consideration for Portable Transistor Reflex Receivers," by Fournier, May-June 1958, R.C.A. publication SJ-1344.

Article, "Transistor Reflex Circuit," in "Electronics," Jan. 3, 1958.